US012770995B2

(12) United States Patent
Liu

(10) Patent No.: US 12,770,995 B2
(45) Date of Patent: Oct. 20, 2026

(54) BATTERY MODULE AND OPERATION METHOD THEREOF

(71) Applicant: Chien-Lee Liu, Taipei City (TW)

(72) Inventor: Chien-Lee Liu, Taipei City (TW)

(73) Assignee: COMPAL ELECTRONICS, INC., Taipei City (TW)

( * ) Notice: Subject to any disclaimer, the term of this patent is extended or adjusted under 35 U.S.C. 154(b) by 781 days.

(21) Appl. No.: 17/947,179

(22) Filed: Sep. 19, 2022

(65) Prior Publication Data

US 2024/0014527 A1 Jan. 11, 2024

(30) Foreign Application Priority Data

Jul. 7, 2022 (TW) ................................ 111125513

(51) Int. Cl.
*H01M 50/569* (2021.01)
*G01R 31/364* (2019.01)
(Continued)

(52) U.S. Cl.
CPC ........ *H01M 50/569* (2021.01); *G01R 31/364* (2019.01); *G01R 31/3835* (2019.01); *H01M 10/4257* (2013.01); *H01M 10/482* (2013.01); *H02J 7/96* (2026.01); *H01M 2010/4271* (2013.01)

(58) Field of Classification Search
CPC ........... H01M 50/569; H01M 10/4257; H01M 10/482; H01M 10/4207; H01M 10/425; H01M 2010/4271; G01R 31/364; G01R 31/3835; Y02E 60/10; H02J 7/007182; H02J 7/0013; H02J 7/0048
See application file for complete search history.

(56) References Cited

U.S. PATENT DOCUMENTS

| | | | | |
|---|---|---|---|---|
| 2002/0014880 | A1 | 2/2002 | McAndrews | |
| 2005/0057220 | A1* | 3/2005 | Miwa | H02J 7/0013 320/116 |

(Continued)

FOREIGN PATENT DOCUMENTS

| | | | |
|---|---|---|---|
| CN | 113644701 | A | 11/2021 |
| KR | 20190108411 | A | 9/2019 |

(Continued)

OTHER PUBLICATIONS

"Office Action of China counterpart Application", issued on Jul. 23, 2026, p. 1-p. 11.

*Primary Examiner* — Adam A Arciero
(74) *Attorney, Agent, or Firm* — JCIPRNET

(57) ABSTRACT

A battery module and an operation method thereof are provided. The battery module includes multiple battery cells and a controller. Each of the battery cells has a power voltage terminal and a reference voltage terminal. The power voltage terminals of the battery cells are commonly coupled to a power voltage line of the battery module. The reference voltage terminals of the battery cells are commonly coupled to a reference voltage line of the battery module. Electrical energy of the power voltage line and the reference voltage line is used to supply power to a load system outside the battery module. The controller is coupled to the power voltage line and the reference voltage line to monitor charging and discharging operations of the battery cells.

9 Claims, 6 Drawing Sheets

(51) Int. Cl.

| | |
|---|---|
| ***G01R 31/3835*** | (2019.01) |
| ***H01M 10/42*** | (2006.01) |
| ***H01M 10/48*** | (2006.01) |
| ***H02J 7/96*** | (2026.01) |

(56) References Cited

U.S. PATENT DOCUMENTS

| | | | | |
|---|---|---|---|---|
| 2013/0015913 | A1 | 1/2013 | Horikawa et al. | |
| 2014/0356656 | A1* | 12/2014 | Chen ................. | H01M 10/6556 429/62 |
| 2020/0052524 | A1* | 2/2020 | Mergener .................. | H02J 7/00 |

FOREIGN PATENT DOCUMENTS

| | | |
|---|---|---|
| TW | 200634526 | 10/2006 |
| TW | 200634562 | 10/2006 |
| TW | M553883 | 1/2018 |

* cited by examiner

BATTERY MODULE AND OPERATION METHOD THEREOF

CROSS-REFERENCE TO RELATED APPLICATION

This application claims the priority benefit of Taiwan application serial no. 111125513, filed on Jul. 7, 2022. The entirety of the above-mentioned patent application is hereby incorporated by reference herein and made a part of this specification.

BACKGROUND

Technical Field

The disclosure relates to a battery, and more particularly to a battery module and an operation method thereof.

Description of Related Art

The portable electronic equipment requires a battery module to provide electrical energy. The battery module may provide a rated voltage to an electronic equipment (a load system). Generally speaking, the battery module has multiple battery cells. The battery cells are connected in series to provide the rated voltage. The battery cells connected in series must be of the same specification. For example, the capacities of the battery cells must all be 2500 milliampere hours (mAh).

SUMMARY

The disclosure provides a battery module and an operation method thereof to allow the use of battery cells with different capacities.

In an embodiment of the disclosure, the battery module includes multiple battery cells and a controller. Each of the battery cells has a power voltage terminal and a reference voltage terminal. The power voltage terminals of the battery cells are commonly coupled to a power voltage line of the battery module. The reference voltage terminals of the battery cells are commonly coupled to a reference voltage line of the battery module. Electrical energy of the power voltage line and the reference voltage line is used to supply power to a load system outside the battery module. The controller is coupled to the power voltage line and the reference voltage line. The controller is used to monitor charging and discharging operations of the battery cells.

In an embodiment of the disclosure, the operation method includes the following steps. When a battery module operates in a discharging mode, a voltage regulating circuit of the battery module converts a discharging voltage of a power voltage line of the battery module into an output voltage of a power voltage electrode of the battery module based on a voltage request to supply power to a load system outside the battery module. When the battery module operates in a charging mode, the voltage regulating circuit converts an input voltage of the power voltage electrode into a charging voltage of the power voltage line. Each of multiple battery cells of the battery module has a power voltage terminal and a reference voltage terminal, the power voltage terminals of the battery cells are commonly coupled to the power voltage line, the reference voltage terminals of the battery cells are commonly coupled to a reference voltage line of the battery module, and the reference voltage line is coupled to a reference voltage bus bar of the load system through the reference voltage electrode of the battery module.

Based on the above, the battery cells according to the embodiments of the disclosure are connected in parallel. Therefore, the battery module may use the battery cells with different capacities (different sizes). The battery module is also configured with the voltage regulating circuit to convert the discharging voltages of the battery cells into the output voltage of the battery module, thereby supplying power to the load system outside the battery module. That is, the battery module may raise (or lower) the discharging voltages of the battery cells to a rated output voltage according to the voltage request of the load system.

In order for the features and advantages of the disclosure to be more comprehensible, the following specific embodiments are described in detail in conjunction with the drawings.

DETAILED DESCRIPTION OF DISCLOSED EMBODIMENTS

Figure 1:
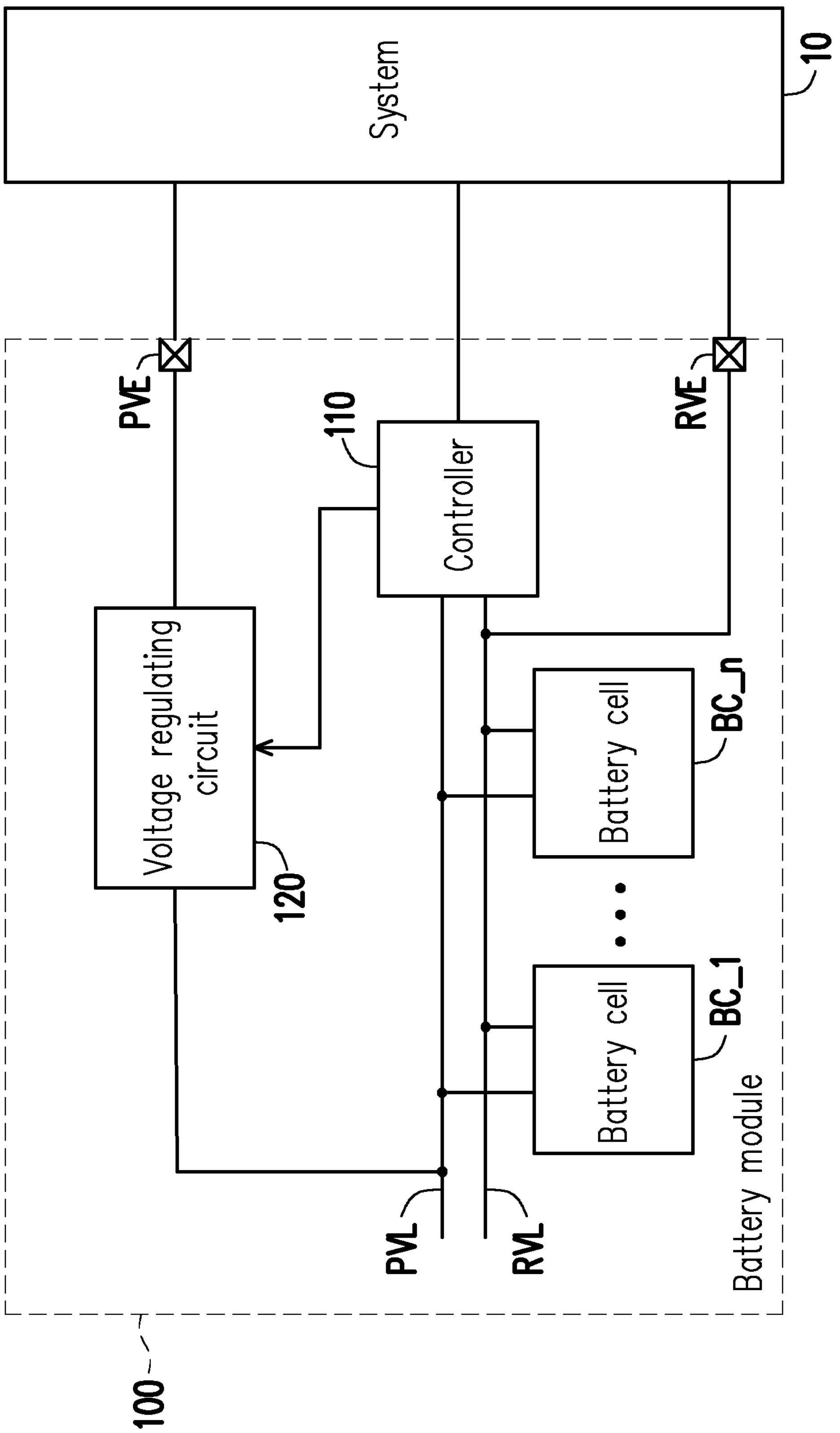
FIG. 1 is a schematic diagram of a circuit block of a battery module according to an embodiment of the disclosure.

The term "coupling (or connection)" used in the entire specification (including the claims) of the disclosure may refer to any direct or indirect connection means. For example, if a first device is described as being coupled (or connected) to a second device, it should be interpreted that the first device may be directly connected to the second device or the first device may be indirectly connected to the second device through another device or certain connection means. Terms such as "first" and "second" mentioned in the entire specification (including the claims) of the disclosure are used to name the elements or to distinguish between different embodiments or ranges, but not to limit the upper limit or the lower limit of the number of elements or to limit the sequence of the elements. In addition, wherever possible, elements/components/steps using the same reference numerals in the drawings and embodiments represent the same or similar parts. Related descriptions of the elements/components/steps using the same reference numerals or using the same terminologies in different embodiments may be cross-referenced.

FIG. 1 is a schematic diagram of a circuit block of a battery module 100 according to an embodiment of the disclosure. FIG. 1 shows an electronic equipment including a system 10 and the battery module 100. Based on the actual design, the electronic equipment shown in FIG. 1 may be a notebook computer, a tablet computer, or other electronic equipment using battery modules. In the embodiment shown in FIG. 1, the battery module 100 includes a controller 110, a voltage regulating circuit 120, and multiple battery cells BC_1, . . . , BC_n. A number n of the battery cells BC_1 to BC_n may be determined according to the actual design. The battery cells BC_1 to BC_n have rated output voltages matched with each other. The battery cells BC_1 to BC_n may have different (or the same) rated capacities. For example (but not limited to), the capacity of the battery cell BC_1 may be 2200 milliampere hours (mAh), and the capacity of the battery cell BC_1 may be 2700 mAh. In terms of size, the battery cells BC_1 to BC_n may have different (or the same) geometric shapes/sizes. The capacities (geometric shapes) of the battery cells BC_1 to BC_n may be determined and selected according to the actual design.

Each of the battery cells BC_1 to BC_n has a power voltage terminal and a reference voltage terminal. The power voltage terminals of the battery cells BC_1 to BC_n are commonly coupled to a power voltage line PVL of the battery module 100. The reference voltage terminals of the battery cells BC_1 to BC_n are commonly coupled to a reference voltage line RVL of the battery module 100. According to the actual design, the level of the reference voltage line RVL may be a ground voltage level or other fixed voltage levels. Electrical energy of the power voltage line PVL and the reference voltage line RVL may supply power to the system 10 (a load system) outside the battery module 100.

In the embodiment shown in FIG. 1, the reference voltage line RVL is coupled to a reference voltage bus bar (not shown) of the system 10 through a reference voltage electrode RVE of the battery module 100. A first terminal and a second terminal of the voltage regulating circuit 120 are respectively coupled to the power voltage line PVL and a power voltage electrode PVE of the battery module 100. The power voltage electrode PVE is used to couple to a power voltage bus bar (not shown) of the system 10. The controller 110 is coupled to the power voltage line PVL and the reference voltage line RVL. The controller 110 may monitor charging and discharging operations of the battery cells BC_1 to BC_n. In addition, the controller 110 may negotiate with the system 10. According to a negotiation result (according to a request of the system 10), the controller 110 may control the voltage regulating circuit 120 to adjust the level of an output voltage of the power voltage electrode PVE.

Figure 2:
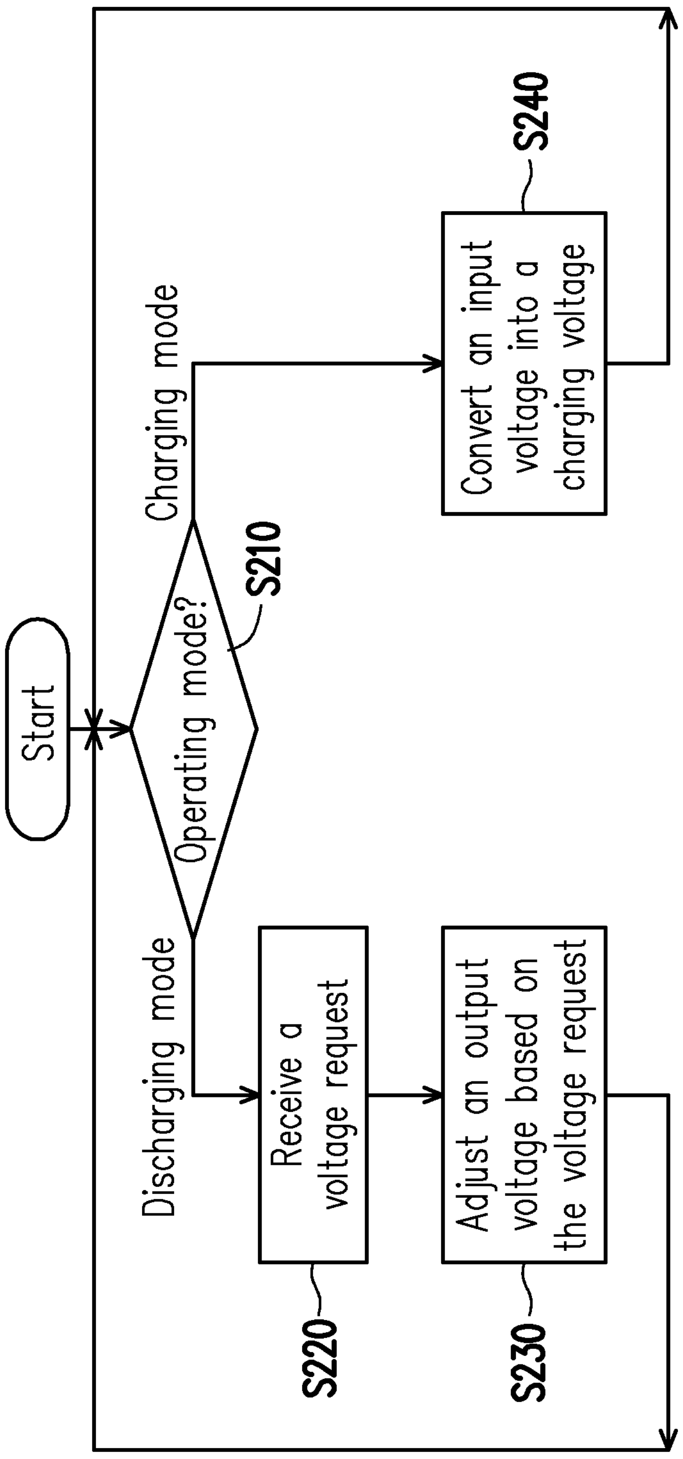
FIG. 2 is a schematic flowchart of an operation method of a battery module according to an embodiment of the disclosure.

FIG. 2 is a schematic flowchart of an operation method of a battery module according to an embodiment of the disclosure. Please refer to FIG. 1 and FIG. 2. According to a voltage difference between the power voltage line PVL and the reference voltage line RVL and/or according to a command of the system 10, the controller 110 may judge an operating mode of the battery module 100 in Step S210. When the battery module 100 operates in a discharging mode (a judgement result of Step S210 is "discharging mode"), the controller 110 may perform Step S220 to receive a voltage request sent by the system 10. In Step S230, the controller 110 may control the voltage regulating circuit 120 according to the voltage request of the system 10, and the voltage regulating circuit 120 converts a discharging voltage of the power voltage line PVL into an output voltage of the power voltage electrode PVE based on the control of the controller 110. Therefore, the voltage regulating circuit 120 may adjust the level of the output voltage of the power voltage electrode PVE based on the voltage request of the system 10 to supply power to the system 10 (the load system) outside the battery module 100.

When the battery module 100 operates in a charging mode (the judgement result of Step S210 is "charging mode"), the controller 110 may perform Step S240. The controller 110 may control the voltage regulating circuit 120 in Step S240 to perform a charging operation on the battery cells BC_1 to BC_n. Based on the control of the controller 110, the voltage regulating circuit 120 may convert an input voltage of the power voltage electrode PVE into a charging voltage of the power voltage line PVL. Therefore, the voltage regulating circuit 120 may perform the charging operation on the battery cells BC_1 to BC_n.

Figure 3:
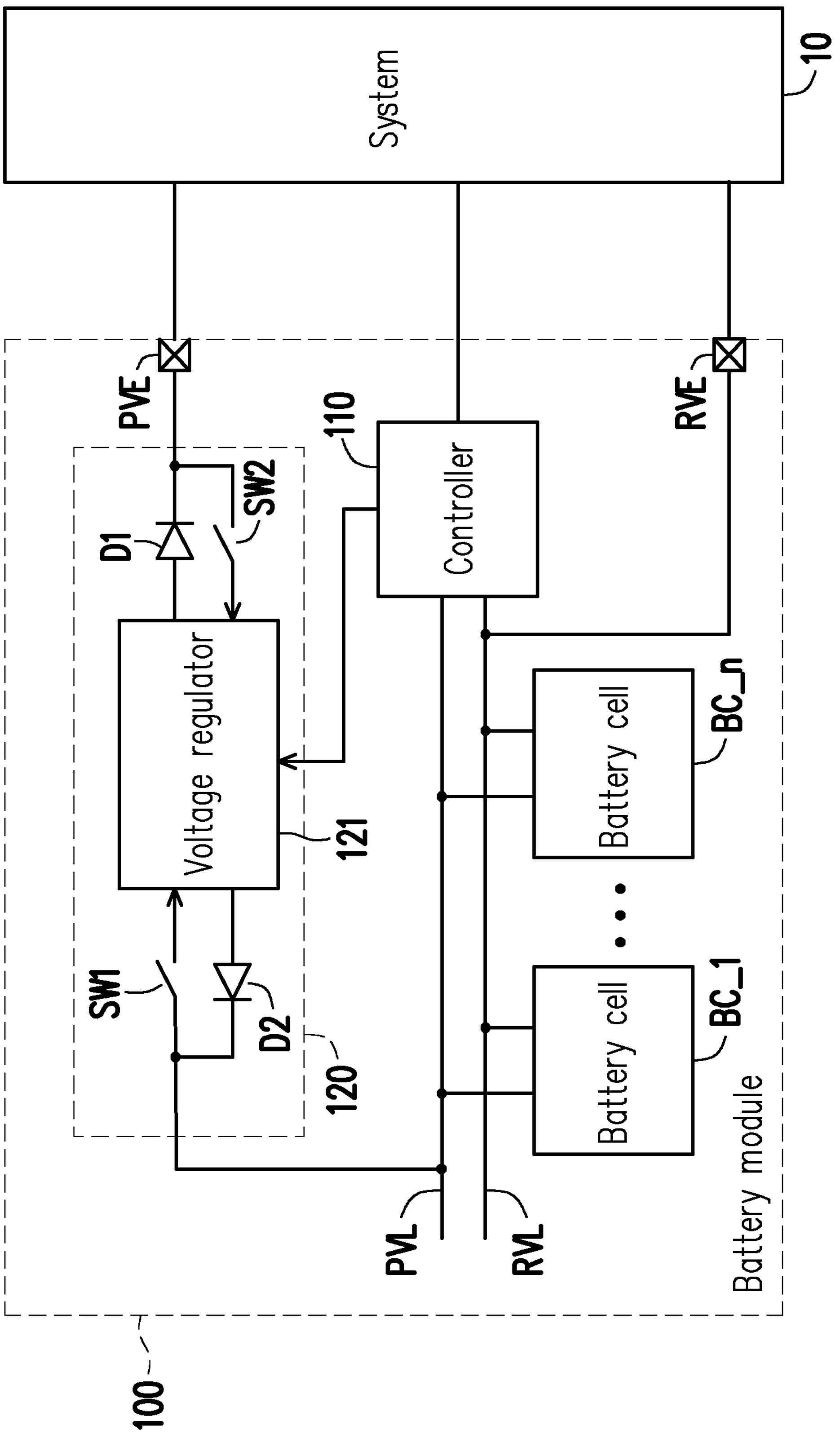
FIG. 3 is a schematic diagram of a circuit block of a voltage regulating circuit according to an embodiment of the disclosure.

The specific implementation of the voltage regulating circuit 120 may vary depending on the actual design. For example, FIG. 3 is a schematic diagram of a circuit block of a voltage regulating circuit 120 according to an embodiment of the disclosure. For the system 10, the controller 110, the voltage regulating circuit 120, and the battery cells BC_1 to BC_n shown in FIG. 3, reference may be made to the related description of FIG. 1 and FIG. 2, so there will be no reiteration. In the embodiment shown in FIG. 3, the voltage regulating circuit 120 includes a voltage regulator 121, a discharge power switch SW1, a discharging diode D1, a charge power switch SW2, and a charging diode D2. The voltage regulator 121, the discharge power switch SW1, and the charge power switch SW2 are controlled by the controller 110. A first terminal of the discharge power switch SW1 is coupled to the power voltage line PVL. A second terminal of the discharge power switch SW1 is coupled to a first input terminal of the voltage regulator 121. An anode of the discharging diode D1 is coupled to a first output terminal of the voltage regulator 121. A cathode of the discharging diode D1 is coupled to the power voltage electrode PVE. A first terminal of the charge power switch SW2 is coupled to the power voltage electrode PVE. A second terminal of the charge power switch SW2 is coupled to a second input terminal of the voltage regulator 121. An anode of the charging diode D2 is coupled to a second output terminal of the voltage regulator 121. A cathode of the charging diode D2 is coupled to the power voltage line PVL.

The embodiment does not limit the specific implementation of the voltage regulator 121. For example, according to the actual design, the voltage regulator 121 may include a boost converter, a buck converter, a buck-boost converter, and/or other DC-to-DC converters. When the battery module 100 operates in the discharging mode, the discharge power switch SW1 is turned on, the charge power switch SW2 is turned off, and the voltage regulator 121 converts the discharging voltage of the power voltage line PVL into the output voltage of the power voltage electrode PVE based on the control of the controller 110. For example, the voltage regulator 121 may raise (or lower) the discharging voltage of the power voltage line PVL to the rated output voltage to the power voltage electrode PVE based on the control of the controller 110.

When the battery module 100 operates in the charging mode, the charge power switch SW2 is turned on, the discharge power switch SW1 is turned off, and the voltage regulator 121 converts the input voltage of the power voltage electrode PVE into the charging voltage of the power voltage line PVL based on the control of the controller 110. For example, the voltage regulator 121 may lower (or raise) the input voltage of the power voltage electrode PVE to the charging voltage to the power voltage line PVL based on the control of the controller 110. Therefore, the voltage regulator 121 may perform the charging operation on the battery cells BC_1 to BC_n.

Figure 4:
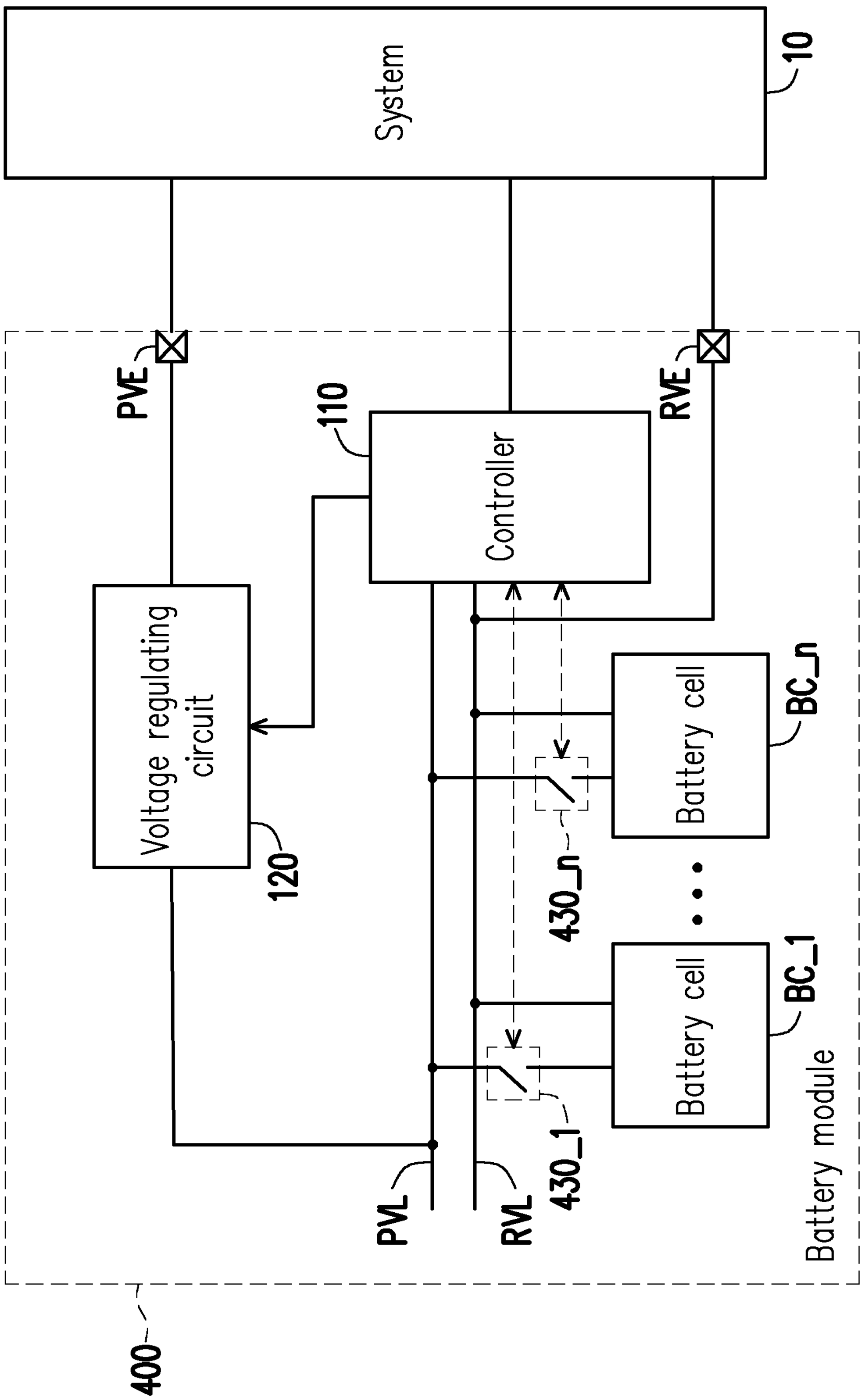
FIG. 4 is a schematic diagram of a circuit block of a battery module according to another embodiment of the disclosure.

FIG. 4 is a schematic diagram of a circuit block of a battery module 400 according to another embodiment of the disclosure. In the embodiment shown in FIG. 4, a battery module 400 includes a controller 110, a voltage regulating circuit 120, sensor and switch circuits 430_1 to **430_*n*, and battery cells BC_1 to BC_n. The system 10, the battery module 400, the controller 110, the voltage regulating circuit 120, and the battery cells BC_1 to BC_n shown in FIG. 4 may be analogized with reference to the related description of the system 10, the battery module 100, the controller 110, the voltage regulating circuit 120, and the battery cells BC_1 to BC_n shown in FIG. 1**, so there will be no reiteration.

The sensor and switch circuits 430_1 to **430_*n* are controlled by the controller 110. In the embodiment shown in FIG. 4, a power voltage terminal of each of the battery cells BC_1 to BC_n is selectively coupled to a power voltage line PVL through a corresponding one of the sensor and switch circuits 430_1 to 430_*n*. According to the actual design, in some embodiments, the controller 110 may sense a current electric quantity of each of the battery cells BC_1 to BC_n through the sensor and switch circuits 430_1 to 430_*n*. The controller 110 may manage a connection state between a power voltage terminal of each of the battery cells BC_1 to BC_n and the power voltage line PVL according to the current electric quantities of the battery cells BC_1 to BC_n. For example, when the battery module 400 operates in a discharging mode, when the current electric quantity of a certain one of the battery cells BC_1 to BC_n (hereinafter referred to as a target battery cell) reaches a rated lower limit electric quantity of the target battery cell, the controller 110 may control a corresponding one of the sensor and switch circuits 430_1 to 430_*n*** to cut off the connection between a power voltage terminal of the target battery cell and the power voltage line PVL.

For example, each of the sensor and switch circuits 430_1 to **430_*n* may include a sensing circuit and a switch circuit. The controller 110 may monitor an output voltage and an output current of the battery cell BC_1 through the sensor and switch circuit 430_1, thereby calculating the current electric quantity of the battery cell BC_1. When the current electric quantity of the battery cell BC_1 does not reach the rated lower limit electric quantity of the battery cell BC_1, the controller 110 may control the sensor and switch circuit 430_1 to maintain the connection between the battery cell BC_1 and the power voltage line PVL. When the current electric quantity of the battery cell BC_1 reaches the rated lower limit electric quantity of the battery cell BC_1, the controller 110 may control the sensor and switch circuit 430_1 to cut off the connection between the battery cell BC_1** and the power voltage line PVL.

When the battery module 400 operates in a charging mode, when the current electric quantity of the target battery cell among the battery cells BC_1 to BC_n reaches a rated upper limit electric quantity of the target battery cell, the controller 110 may control a corresponding one of the sensor and switch circuits 430_1 to **430_*n* to cut off the connection between the power voltage terminal of the target battery cell and the power voltage line PVL. For example, the controller 110 may monitor the output voltage and the output current of the battery cell BC_1 through the sensor and switch circuit 430_1, thereby calculating the current electric quantity of the battery cell BC_1. When the current electric quantity of the battery cell BC_1 does not reach the rated upper limit electric quantity of the battery cell BC_1, the controller 110 may control the sensor and switch circuit 430_1 to maintain the connection between the battery cell BC_1 and the power voltage line PVL. When the current electric quantity of the battery cell BC_1 reaches the rated upper limit electric quantity of the battery cell BC_1, the controller 110 may control the sensor and switch circuit 430_1 to cut off the connection between the battery cell BC_1** and the power voltage line PVL.

Figure 5:
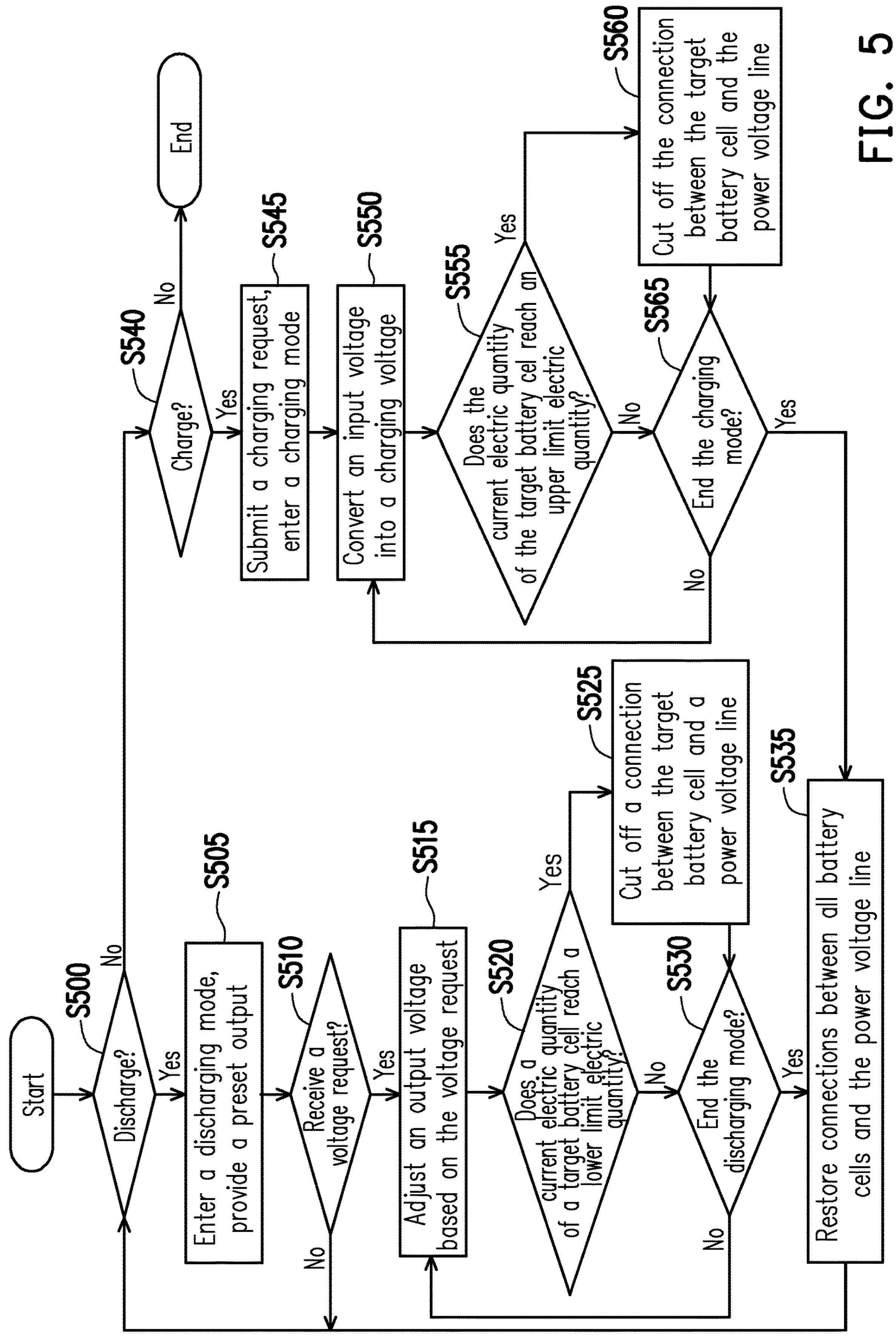
FIG. 5 is a schematic flowchart of an operation method of a battery module according to another embodiment of the disclosure.

FIG. 5 is a schematic flowchart of an operation method of a battery module according to another embodiment of the disclosure. Please refer to FIG. 4 and FIG. 5. According to a voltage difference between the power voltage line PVL and a reference voltage line RVL and/or according to a command of the system 10, the controller 110 may judge whether the battery module 400 should be discharged. When the controller 110 judges that the battery module 400 should be discharged (a judgement result of Step S500 is "Yes"), the controller 110 may perform Step S505 to enter the discharging mode and control the voltage regulating circuit 120 to provide a preset output to the system 10. For example (but not limited to), before completing power negotiation with the system 10, the voltage regulating circuit 120 may pre-provide an output voltage (the preset output) of 5 volts to the system 10 through a power voltage electrode PVE.

In Step S510, the controller 110 may judge whether a voltage request sent by the system 10 is received. When the controller 110 does not receive the voltage request of the system 10 (a judgement result of Step S510 is "No"), the controller 110 may return to Step S500. When the controller 110 receives the voltage request of the system 10 (the judgement result of Step S510 is "Yes"), the controller 110 may perform Step S515. In Step S515, the controller 110 may control the voltage regulating circuit 120 according to the voltage request of the system 10, and the voltage regulating circuit 120 converts a discharging voltage of the power voltage line PVL into an output voltage of the power voltage electrode PVE based on the control of the controller 110. Therefore, the voltage regulating circuit 120 may adjust the level of the output voltage of the power voltage electrode PVE based on the voltage request of the system 10 to supply power to the system 10 (a load system).

In Step S520, the controller 110 may sense the current electric quantity of each of the battery cells BC_1 to BC_n through the sensor and switch circuits 430_1 to **430_*n*. The controller 110 may manage a connection state between the power voltage terminal of each of the battery cells BC_1 to BC_n and the power voltage line PVL according to the current electric quantities of the battery cells BC_1 to BC_n. For example, when the battery module 400 operates in the discharging mode, when the current electric quantity of a certain one of the battery cells BC_1 to BC_n (hereinafter referred to as the target battery cell) reaches the rated lower limit electric quantity of the target battery cell (a judgement result of Step S520 is "Yes"), the controller 110 may control a corresponding one of the sensor and switch circuits 430_1 to 430_*n* to cut off the connection between the power voltage terminal of the target battery cell and the power voltage line PVL (Step S525). For example, when the current electric quantity of the battery cell BC_1 reaches the rated lower limit electric quantity of the battery cell BC_1, the controller 110 may control the sensor and switch circuit 430_1 to cut off the connection between the battery cell BC_1** and the power voltage line PVL.

In Step S530, the controller 110 may judge whether the discharging mode should end. When the controller 110 judges that the discharging mode should be maintained (a judgement result of Step S530 is "No"), the controller 110 may return to Step S515. When the controller 110 judges that the discharging mode should end (the judgement result of Step S530 is "Yes"), the controller 110 may perform Step S535 to restore the connections between all the battery cells BC_1 to BC_n and the power voltage line PVL. For example (but not limited to), when the number of battery cells cut off from the connection to the power voltage line PVL exceeds a threshold number (the threshold number may be determined according to the actual design) and/or when the system 10 issues a "stop discharging" command, the controller 110 may end the discharging mode, and control the sensor and switch circuits 430_1 to 430_*n* to restore the connections between all the battery cells BC_1 to BC_n and the power voltage line PVL. After completing Step S535, the controller 110 may return to Step S500.

When the controller 110 judges that the battery module 400 should not be discharged (the judgement result of Step S500 is "No"), the controller 110 may perform Step S540. According to a voltage difference between the power voltage line PVL and the reference voltage line RVL and/or according to the command of the system 10, the controller 110 may judge whether the battery module 400 should be charged. When the controller 110 judges that the battery module 400 should be charged (a judgement result of Step S540 is "Yes"), the controller 110 may perform Step S545 to submit a charging request to the system 10 and enter the charging mode.

When the battery module 100 operates in the charging mode, the controller 110 may control the voltage regulating circuit 120 in Step S550 to perform a charging operation on the battery cells BC_1 to BC_n. Based on the control of the controller 110, the voltage regulating circuit 120 may convert an input voltage of the power voltage electrode PVE into the charging voltage of the power voltage line PVL. Therefore, the voltage regulating circuit 120 perform the charging operation on the battery cells BC_1 to BC_n.

In Step S555, the controller 110 may sense the current electric quantity of each of the battery cells BC_1 to BC_n through the sensor and switch circuits 430_1 to 430_*n*. The controller 110 may manage the connection state between the power voltage terminal of each of the battery cells BC_1 to BC_n and the power voltage line PVL according to the current electric quantities of the battery cells BC_1 to BC_n. For example, when the battery module 400 operates in the charging mode, when the current electric quantity of a certain one of the battery cells BC_1 to BC_n (hereinafter referred to as the target battery cell) reaches the rated upper limit electric quantity of the target battery cell (a judgement result of Step S555 is "Yes"), the controller 110 may control a corresponding one of the sensor and switch circuits 430_1 to 430_*n* to cut off the connection between the power voltage terminal of the target battery cell and the power voltage line (Step S560). For example, when the current electric quantity of the battery cell BC_1 reaches the rated upper limit electric quantity of the battery cell BC_1, the controller 110 may control the sensor and switch circuit 430_1 to cut off the connection between the battery cell BC_1 and the power voltage line PVL.

In Step S565, the controller 110 may judge whether the charging mode should end. When the controller 110 judges that the charging mode should be maintained (a judgement result of Step S565 is "No"), the controller 110 may return to Step S550. When the controller 110 judges that the discharging mode should end (the judgement result of Step S565 is "Yes"), the controller 110 may perform Step S535 to restore the connections between all the battery cells BC_1 to BC_n and the power voltage line PVL. For example (but not limited to), when the number of battery cells cut off from the connection to the power voltage line PVL exceeds the threshold number (the threshold number may be determined according to the actual design) and/or when the system 10 issues a "stop charging" command, the controller 110 may end the charging mode, and control the sensor and switch circuits 430_1 to 430_*n* to restore the connections between all the battery cells BC_1 to BC_n and the power voltage line PVL. After completing Step S535, the controller 110 may return to Step S500.

Please refer to FIG. 4. In other embodiments, the controller 110 may sense a health state of each of the battery cells BC_1 to BC_n through the sensor and switch circuits 430_1 to 430_*n*. The controller 110 may manage the connection state between the power voltage terminal of each of the battery cells BC_1 to BC_n and the power voltage line PVL according to the health states of the battery cells BC_1 to BC_n. For example, when the health state of one of the battery cells BC_1 to BC_n (hereinafter referred to as the target battery cell) is abnormal, the controller 110 may control a corresponding one of the sensor and switch circuits 430_1 to 430_*n* to cut off the connection between the power voltage terminal of the target battery cell and the power voltage line PVL. When the health state of the target battery cell among the battery cells BC_1 to BC_n is normal, the controller 110 may control a corresponding one of the sensor and switch circuits 430_1 to 430_*n* to maintain the connection between the power voltage terminal of the target battery cell and the power voltage line PVL.

For example, it is assumed that the health state of the battery cell BC_1 is abnormal, and the health state of the battery cell BC_n is normal. When the controller 110 senses that the health state of the battery cell BC_1 is abnormal through the sensor and switch circuit 430_1, the controller 110 may control the sensor and switch circuit 430_1 to cut off the connection between the battery cell BC_1 and the power voltage line PVL. When the controller 110 senses that the health state of the battery cell BC_n is normal through the sensor and switch circuit 430_*n*, the controller 110 may control the sensor and switch circuit 430_*n* to maintain the connection between the battery cell BC_n and the power voltage line PVL.

Figure 6:
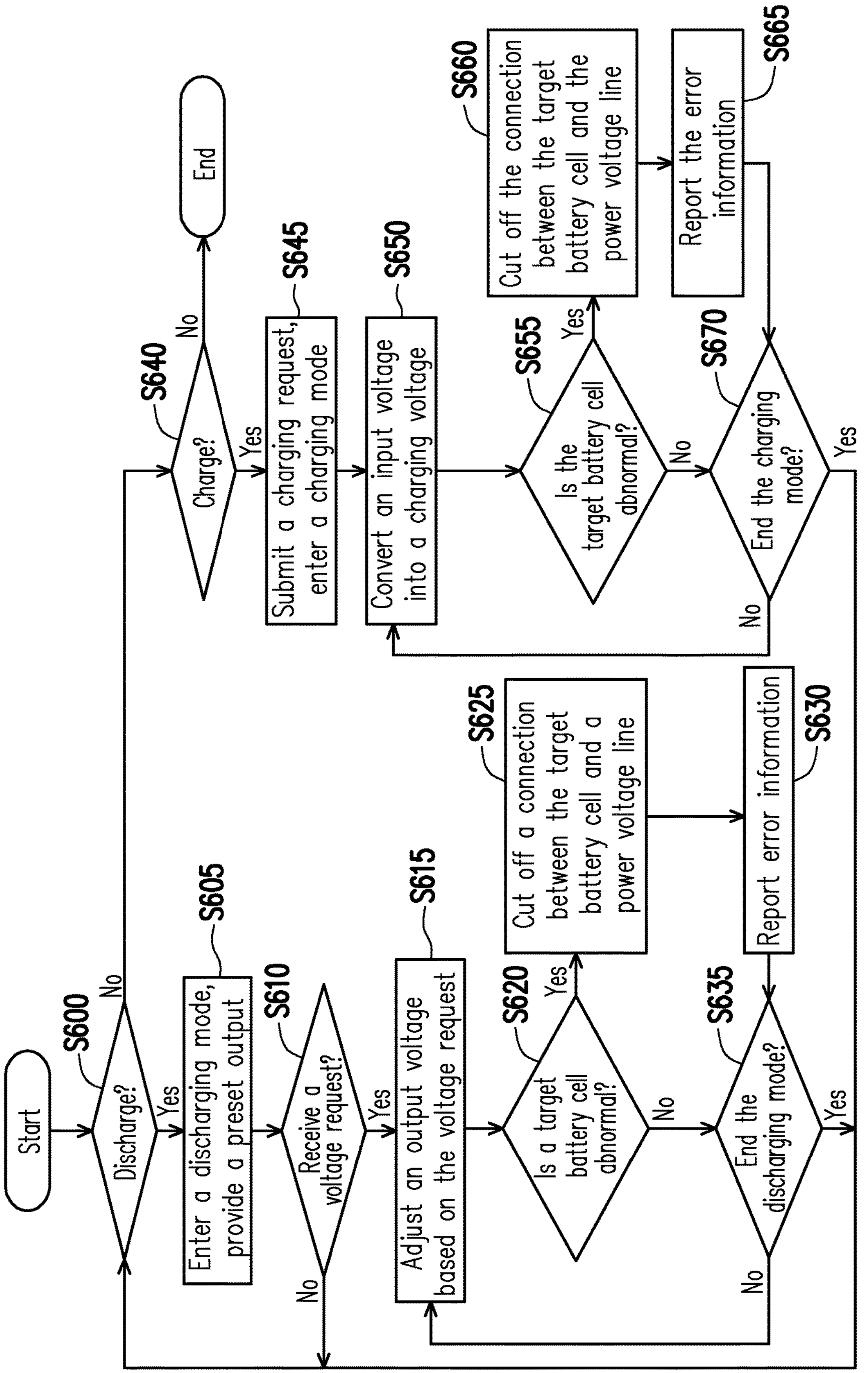
FIG. 6 is a schematic flowchart of an operation method of a battery module according to yet another embodiment of the disclosure.

FIG. 6 is a schematic flowchart of an operation method of a battery module according to yet another embodiment of the disclosure. Steps S600, S605, S610, S615, S635, S640, S645, S650, and S670 shown in FIG. 6 may be analogized with reference to the related description of Steps S500, S505, S510, S515, S530, S540, S545, S550, and S565 shown in FIG. 5, so there will be no reiteration. Please refer to FIG. 4 and FIG. 6. In Step S620, the controller 110 may sense the health state of each of the battery cells BC_1 to BC_n through the sensor and switch circuits 430_1 to 430_*n*. The controller 110 may manage the connection state between the power voltage terminal of each of the battery cells BC_1 to BC_n and the power voltage line PVL according to the health states of the battery cells BC_1 to BC_n.

For example, when the battery module 400 operates in the discharging mode, when the health state of a certain one of the battery cells BC_1 to BC_n (hereinafter referred to as the target battery cell) is abnormal (a judgement result of Step S620 is "Yes"), the controller 110 may control a corresponding one of the sensor and switch circuits 430_1 to 430_*n* to cut off the connection between the power voltage terminal of the target battery cell and the power voltage line PVL (Step S625). When the health state of the target battery cell among the battery cells BC_1 to BC_n is normal, the controller 110 may control a corresponding one of the sensor and switch circuits 430_1 to **430_*n* to maintain the connection between the power voltage terminal of the target battery cell and the power voltage line PVL. For example, it is assumed that the controller 110 senses that the health state of the battery cell BC_1 is abnormal through the sensor and switch circuit 430_1, and the controller 110 senses that the health state of the battery cell BC_n is normal through the sensor and switch circuit 430_*n*. The controller 110 may control the sensor and switch circuit 430_1 to cut off the connection between the battery cell BC_1 and the power voltage line PVL, and the controller 110 may control the sensor and switch circuit 430_*n*** to maintain the connection between the battery cell BC_n and the power voltage line PVL.

In Step S630, the controller 110 may report error information related to "abnormal battery cell" to the system 10. After completing Step S630, the controller 110 may perform Step S635 to judge whether the discharging mode should end. When the controller 110 judges that the discharging mode should be maintained (a judgement result of Step S635 is "No"), the controller 110 may return to Step S615. When the controller 110 judges that the discharging mode should end (the judgement result of Step S635 is "Yes"), the controller 110 may return to Step S600.

In Step S655, the controller 110 may sense the health state of each of the battery cells BC_1 to BC_n through the sensor and switch circuits 430_1 to **430_*n*. For example, when the battery module 400 operates in the charging mode, when the health state of one of the battery cells BC_1 to BC_n (hereinafter referred to as the target battery cell) is abnormal (a judgement result of Step S655 is "Yes"), the controller 110 may control a corresponding one of the sensor and switch circuits 430_1 to 430_*n* to cut off the connection between the power voltage terminal of the target battery cell and the power voltage line PVL (Step S660). When the health state of the target battery cell among the battery cells BC_1 to BC_n is normal, the controller 110 may control a corresponding one of the sensor and switch circuits 430_1 to 430_*n* to maintain the connection between the power voltage terminal of the target battery cell and the power voltage line PVL. For example, it is assumed that the controller 110 senses that the health state of the battery cell BC_1 is abnormal through the sensor and switch circuit 430_1, and the controller 110 senses that the health state of the battery cell BC_n is normal through the sensor and switch circuit 430_*n*. The controller 110 may control the sensor and switch circuit 430_1 to cut off the connection between the battery cell BC_1 and the power voltage line PVL, and the controller 110 may control the sensor and switch circuit 430_*n*** to maintain the connection between the battery cell BC_n and the power voltage line PVL.

In Step S665, the controller 110 may report the error information related to the "abnormal battery cell" to the system 10. After completing Step S665, the controller 110 may perform Step S670 to judge whether the discharging mode should end. When the controller 110 judges that the discharging mode should be maintained (a judgement result of Step S670 is "No"), the controller 110 may return to Step S650. When the controller 110 judges that the discharging mode should end (the judgement result of Step S670 is "Yes"), the controller 110 may return to Step S600.

According to different design requirements, the implementation of the controller 110 in the above embodiments may be in the form of hardware, firmware, software (that is, program), or a combination of multiple of the three. In terms of the form of hardware, the controller 110 may be implemented as a logic circuit on an integrated circuit. The related functions of the controller 110 may be implemented as hardware using hardware description languages (for example, Verilog HDL or VHDL) or other suitable programming languages. For example, the related functions of the controller 110 may be implemented in one or more controllers, microcontrollers, microprocessors, application-specific integrated circuits (ASICs), digital signal processors (DSPs), field programmable gate arrays (FPGAs), and/or various logic blocks, modules, and circuits in other processing units. In terms of the form of software and/or firmware, the related functions of the controller 110 may be implemented as programming codes. For example, the controller 110 is implemented using general programming languages (for example, C, C++, or assembly language) or other suitable programming languages. The programming codes may be recorded/stored in a "non-transitory computer readable medium". In some embodiments, the non-transitory computer readable medium includes, for example, a read only memory (ROM), a tape, a disk, a card, a semiconductor memory, a programmable logic circuit, and/or a storage device. A central processing unit (CPU), a controller, a microcontroller, or a microprocessor may read and execute the programming codes from the non-transitory computer readable medium, thereby implementing the related functions of the controller 110.

In summary, the battery cells BC_1 to BC_n according to the embodiments of the disclosure are connected in parallel. Therefore, according to the actual design, the battery module may use the battery cells BC_1 to BC_n with different capacities (different sizes). The battery module is also configured with the voltage regulating circuit 120 to convert the discharging voltages of the battery cells BC_1 to BC_n into the output voltage of the battery module, thereby supplying power to the system 10 outside the battery module. That is, the battery module may raise (or lower) the discharging voltages of the battery cells BC_1 to BC_n to the rated output voltage according to the voltage request of the system 10.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A battery module, comprising:

a plurality of battery cells connected in parallel during a discharging operation, each having a power voltage terminal and a reference voltage terminal, wherein the power voltage terminals of the battery cells are commonly coupled to a power voltage line of the battery module, the reference voltage terminals of the battery cells are commonly coupled to a reference voltage line of the battery module, and electrical energy of the power voltage line and the reference voltage line is used to supply power to a load system outside the battery module;

a controller, coupled to the power voltage line and the reference voltage line, and used to monitor a charging operation and the discharging operation of the battery cells, wherein the reference voltage line is coupled to a reference voltage bus bar of the load system through a reference voltage electrode of the battery module; and a voltage regulating circuit, having a first terminal and a second terminal respectively coupled to the power voltage line and a power voltage electrode of the battery module, wherein the power voltage electrode is used to couple to a power voltage bus bar of the load system.

2. The battery module according to claim 1, wherein:

when the battery module operates in a discharging mode, the voltage regulating circuit converts a discharging voltage of the power voltage line into an output voltage of the power voltage electrode based on control of the controller; and when the battery module operates in a charging mode, the voltage regulating circuit converts an input voltage of the power voltage electrode into a charging voltage of the power voltage line based on control of the controller.

3. The battery module according to claim 1, wherein the voltage regulating circuit comprises:

a voltage regulator, controlled by the controller;

a discharge power switch, controlled by the controller, wherein a first terminal of the discharge power switch is coupled to the power voltage line, and a second terminal of the discharge power switch is coupled to a first input terminal of the voltage regulator;

a discharging diode, having an anode coupled to a first output terminal of the voltage regulator, wherein a cathode of the discharging diode is coupled to the power voltage electrode;

a charge power switch, controlled by the controller, wherein a first terminal of the charge power switch is coupled to the power voltage electrode, and a second terminal of the charge power switch is coupled to a second input terminal of the voltage regulator; and a charging diode, having an anode coupled to a second output terminal of the voltage regulator, wherein a cathode of the charging diode is coupled to the power voltage line.

4. The battery module according to claim 3, wherein:

when the battery module operates in a discharging mode, the discharge power switch is turned on, the charge power switch is turned off, and the voltage regulator converts a discharging voltage of the power voltage line into an output voltage of the power voltage electrode based on control of the controller; and when the battery module operates in a charging mode, the charge power switch is turned on, the discharge power switch is turned off, and the voltage regulator converts an input voltage of the power voltage electrode into a charging voltage of the power voltage line based on control of the controller.

5. The battery module according to claim 1, further comprising:

a plurality of sensor and switch circuits, controlled by the controller, wherein the power voltage terminal of each of the battery cells is selectively coupled to the power voltage line through a corresponding one of the sensor and switch circuits.

6. The battery module according to claim 5, wherein the controller senses a current electric quantity of each of the battery cells through the sensor and switch circuits, and the controller manages a connection state between the power voltage terminal of each of the battery cells and the power voltage line according to the current electric quantities of the battery cells.

7. The battery module according to claim 6, wherein:

when the battery module operates in a discharging mode, when the current electric quantity of a target battery cell among the battery cells reaches a lower limit electric quantity, the controller controls a corresponding one of the sensor and switch circuits to cut off a connection between the power voltage terminal of the target battery cell and the power voltage line; and when the battery module operates in a charging mode, when the current electric quantity of the target battery cell reaches an upper limit electric quantity, the controller controls a corresponding one of the sensor and switch circuits to cut off the connection between the power voltage terminal of the target battery cell and the power voltage line.

8. The battery module according to claim 5, wherein the controller senses a health state of each of the battery cells through the sensor and switch circuits, and the controller manages a connection state between the power voltage terminal of each of the battery cells and the power voltage line according to the health states of the battery cells.

9. The battery module according to claim 8, wherein:

when the health state of a target battery cell among the battery cells is abnormal, the controller controls a corresponding one of the sensor and switch circuits to cut off a connection between the power voltage terminal of the target battery cell and the power voltage line; and when the health state of the target battery cell is normal, the controller controls the corresponding one of the sensor and switch circuits to maintain the connection between the power voltage terminal of the target battery cell and the power voltage line.

* * * * *